US008761552B1

(12) United States Patent
Hochberg et al.

(10) Patent No.: US 8,761,552 B1
(45) Date of Patent: Jun. 24, 2014

(54) FABRICATING WAVEGUIDES IN CONJUNCTION WITH INTERCONNECT FABRICATION IN BACK-ENDS OF INTEGRATED CIRCUITS AND STRUCTURES THEREOF

(75) Inventors: Michael J. Hochberg, Seattle, WA (US); Jeremy Witzens, La Jolla, CA (US)

(73) Assignee: University of Washington through its Center for Commercialization, Seattle, WA (US)

( * ) Notice: Subject to any disclaimer, the term of this patent is extended or adjusted under 35 U.S.C. 154(b) by 293 days.

(21) Appl. No.: 12/963,488

(22) Filed: Dec. 8, 2010

Related U.S. Application Data

(60) Provisional application No. 61/267,713, filed on Dec. 8, 2009.

(51) Int. Cl.
*G02B 6/12* (2006.01)
*G02B 6/122* (2006.01)

(52) U.S. Cl.
CPC ............... *G02B 6/1225* (2013.01); *G02B 6/12* (2013.01)
USPC .............................................. 385/14; 438/31

(58) Field of Classification Search
CPC ............ H01L 21/0237; H01L 21/0242; H01L 21/02458; H01L 21/0254; H01L 21/02573; B82Y 20/00; C23F 1/00; G02B 6/12; G02B 2006/12176
USPC ................................................. 438/31; 385/14
See application file for complete search history.

(56) References Cited

U.S. PATENT DOCUMENTS 5,838,870 A * 11/1998 Soref ............................ 385/131
6,806,111 B1 * 10/2004 Ehrichs et al. ................. 438/29

* cited by examiner

*Primary Examiner* — Ryan Lepisto
*Assistant Examiner* — Erin Chiem
(74) *Attorney, Agent, or Firm* — Perkins Coie LLP

(57) ABSTRACT

Methods for fabricating waveguides in conjunction with interconnect fabrication in back-ends of integrated circuits and structures thereof are disclosed. One method for forming a waveguide in accordance with one embodiment of the disclosure comprises selectively etching a dielectric layer and forming of a core region of a waveguide at a back-end of an integrated circuit. The dielectric layer is material deposited during a cycle of fabrication of the back-end of the integrated circuit. The method further includes depositing a material having a dielectric constant that is suitable to be the core region of the waveguide cladded by the dielectric layer over the dielectric layer and into the etched feature for the core region of the waveguide, and planarizing a surface of the material.

14 Claims, 9 Drawing Sheets

Edge of the chip or partial etch into the back-end
104

Dielectric waveguide in the chip back-end
102

Silicon waveguide (typically in the device layer of an SOI wafer)
106

US 8,761,552 B1

FABRICATING WAVEGUIDES IN CONJUNCTION WITH INTERCONNECT FABRICATION IN BACK-ENDS OF INTEGRATED CIRCUITS AND STRUCTURES THEREOF

CROSS-REFERENCE TO RELATED APPLICATION

This application claims priority to pending U.S. Provisional Patent Application No. 61/267,713 entitled "Methods for manufacturing dielectric waveguides jointly with electrical interconnects in the back-end of chips," filed Dec. 8, 2009, and incorporated herein by reference in its entirety.

TECHNICAL FIELD

The disclosed technology relates generally to integrated circuits with photonics and, in particular, to integration of optical waveguide fabrication with integrated circuit processes.

BACKGROUND

Silicon photonics is an expanding field due to its promise for reducing the cost and increasing performance of optical data communication systems. Functionalities such as detection and modulation can be implemented with devices defined in silicon, since carrier collection and generation are involved. However, integration of optical components and waveguides and the fabrication thereof with existing silicon processes such as CMOS, bipolar, and BiCMOS-style processes remain a challenge due to the fundamentally different material systems, operating principles, and state-of-the-art feature sizes/dimensions.

For example, one difficulty with such processes is that dielectric waveguides are typically large, e.g., in the range of micrometers, and can span dimensions from submicron (typically in tapered structures) up to tens of microns in order to match profiles with large-core fibers. The height of dielectric waveguides is thus much larger than the typical back-end layer thickness in a state-of-the-art integrated circuit and can be difficult to integrate both structurally and in manufacturing processes.

DETAILED DESCRIPTION

The present disclosure is directed to fabricating waveguides in conjunction with interconnect fabrication in back-ends (e.g., interconnect layers) of integrated circuits and the resulting structures thereof. Optical waveguides (e.g., dielectric waveguides) structurally integrated in the back-end of a chip or integrated circuit (IC) have a number of advantages. Accordingly, it also expected to be beneficial to integrate the manufacturing of the waveguide with an interconnect (e.g., metal and/or optical interconnects) fabrication process to utilize existing equipment and provide scalability. A back-end of a chip having integrated waveguides integrated therein can provide a number of advantages over conventional arrangements. For example, the integrated waveguide can be used to facilitate mode expansion to couple light on and off the chip, e.g., via waveguide butt-coupling. Further, due to the reduced index contrast, it can be easier to design tapers or inverse tapers expanding the mode profile of the waveguide. In addition, since the waveguide is located in the back-end above the device silicon layer in an SOI wafer, it provides a larger clearance from the silicon handle and thus provides more room for mode expansion.

Figure 1:
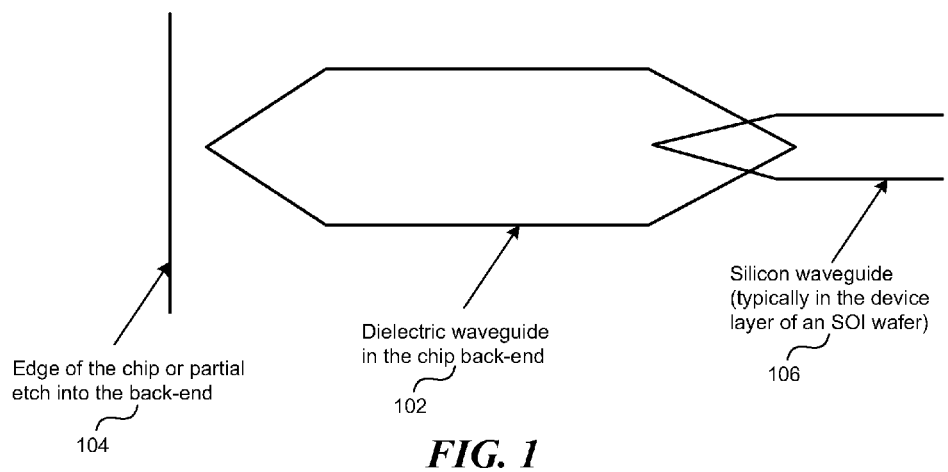
FIG. 1 is a schematic illustration of a silicon waveguide to dielectric waveguide coupling configuration with the dielectric waveguide having an inverse taper towards a back edge of an integrated circuit.

FIG. 1 is a schematic illustration of a silicon waveguide 106 to dielectric waveguide 102 coupling configuration with the dielectric waveguide 102 having an inverse taper towards the back edge 104. This edge 104 can be the chip edge or a partial or complete etch into the back-end or into the back-end of the silicon device layer and the buried oxide (BOX) of an SOI wafer. The edge 104 may also reach down into the handle silicon of the wafer. In the case of other types of wafers, such as silicon on sapphire, silicon on glass, or any other material systems that also support silicon waveguides, the edge can also correspond to the chip edge or to a partial etch into the chip.

Waveguides defined in dielectrics typically have a longer coherence length, i.e., the length of waveguide over which the phase accrued by light remains deterministic, given surface roughness and manufacturing variability. This allows building coherent structures out of dielectric waveguides while minimizing or removing the need for active control to compensate for manufacturing variations. Such structures can include, for example, rings, interleavers, frequency domain multiplexers, and/or delay lines.

Dielectric waveguides generally do not suffer from two-photon absorption (TPA) and can be well suited to transport high optical powers. The light can be split into multiple waveguides with a splitter network prior to coupling into silicon-based structures. Dielectric waveguides can also be used for non-linear effects, such as Raman gain or four wave mixing, since these applications require high power levels and suffer from TPA in silicon waveguides.

The core and cladding of a dielectric waveguide can also be formed using any of the low-k dielectrics used in the integrated circuit fabrication including, by way of example but not limitation, fluorine doped silicon dioxide, carbon doped silicon dioxide, spin-on polymeric dielectrics, spin-on silicone based polymeric dielectrics, or their porous counterparts. For example the core of the waveguide could be silicon nitride and the cladding a low-k dielectric. One advantage of this arrangement is that low-k dielectrics are already present as part of the back-end in high performance or other state-of-the-art ICs. In this configuration, the index contrast between the core and the cladding can be further increased since the cladding starts at a lower index from the low-k dielectric. In some embodiments, the dielectrics in the area surrounding the core (i.e., the cladding) can be partially implanted with an atomic species that reduces the index to form the cladding, for example, implanted with fluorine.

Although some embodiments of the present technology for integrated fabrication of waveguides are described with specific reference to back-ends of integrated circuits containing electrical interconnects, the techniques disclosed herein are also applicable to other types of chips such as photonics chips having optical interconnects or a combination of optical and electrical interconnects.

Many specific details of certain embodiments of the disclosure are set forth in the following description and in FIGS. 2A-7 to provide a thorough understanding of these embodiments. A person skilled in the art, however, will understand that the disclosure may be practiced without several of these details or additional details can be added to the disclosure. Well-known structures and functions have not been shown or described in detail to avoid unnecessarily obscuring the description of the embodiments of the disclosure.

Figure 2A:
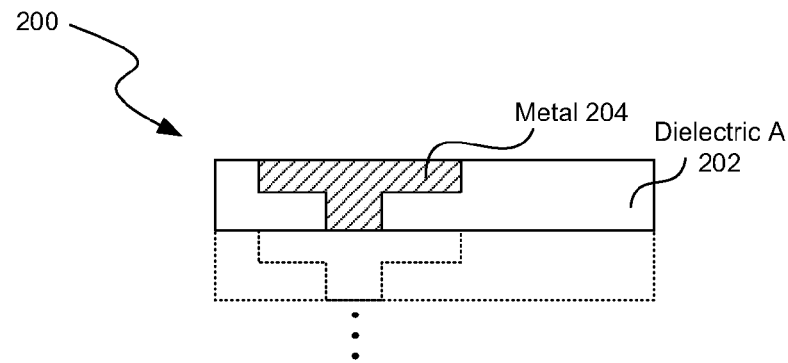
FIGS. 2A-2G are schematic illustrations of an example process for fabricating a waveguide in conjunction with back-end fabrication through direct etching to pattern the core dielectric in accordance with an embodiment of the disclosure.
Figure 2B:
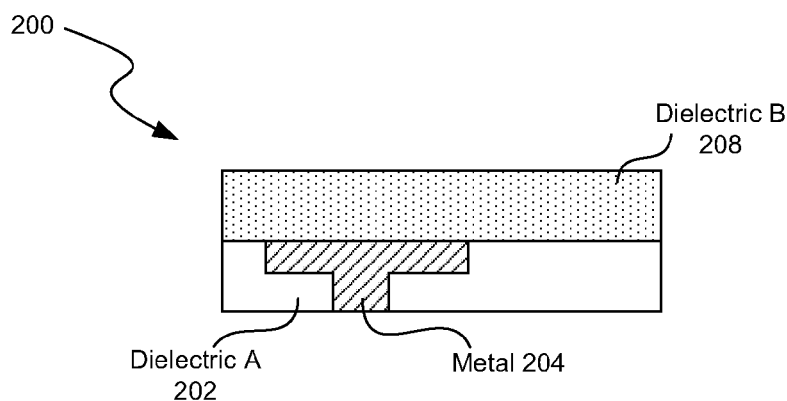

FIGS. 2A-2G are schematic illustrations of an example process 200 for fabricating a waveguide in conjunction with back-end fabrication through direct etching to pattern the core dielectric 208 in accordance with an embodiment of the disclosure. The process starts in FIG. 2A at the beginning of a cycle of fabrication in the back-end (e.g., in the interconnect layer). Although FIG. 2A illustrates an example showing that one interconnect layer (e.g., metal interconnect layer shown in solid black line) has been fabricated, any number of layers (as shown in gray dotted lines) in the back-end can be fabricated before deposition of core dielectric B 208 as shown in FIG. 2B. The core dielectric B 208 is deposited over an outermost layer at a back-end of an integrated circuit. The outermost layer of the back-end comprises, for example, an interconnect layer (e.g., a metal layer) having a dielectric material A 202 and metallic structure 204. The thickness of the deposited dielectric B 208 typically corresponds to the thickness of one layer in the back-end. In general, the maximum thickness of the dielectric B 208 that can be deposited is limited by the thickness of one back-end layer. In some instances, multiple dielectric layers of different materials could potentially be deposited in the step shown in FIG. 2B to form a waveguide core having a graded dielectric index.

The deposited material has a dielectric constant that can be used as a core region of a waveguide cladded by the material 202 in the interconnect layer. The core/cladding dielectric index contrast of dielectric waveguides can be created by using different dielectrics including, for example, silicon dioxide and silicon oxinitride or silicon nitride, by implantation, or by a combination thereof. Silicon nitride, for example, has a higher refractive index than silicon dioxide and can be used for the core of the waveguide. Another example is implanting silicon dioxide with germanium or other atomic species to increase its refractive index.

Figure 2C:
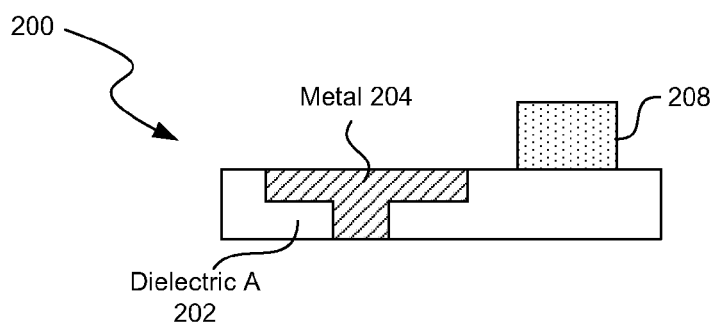
Figure 2D:
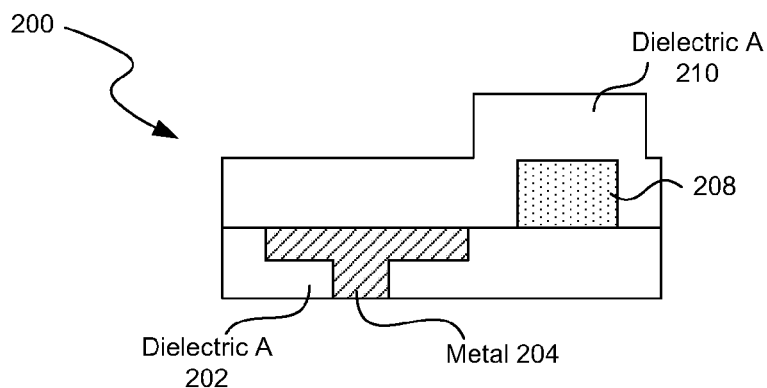
Figure 2E:
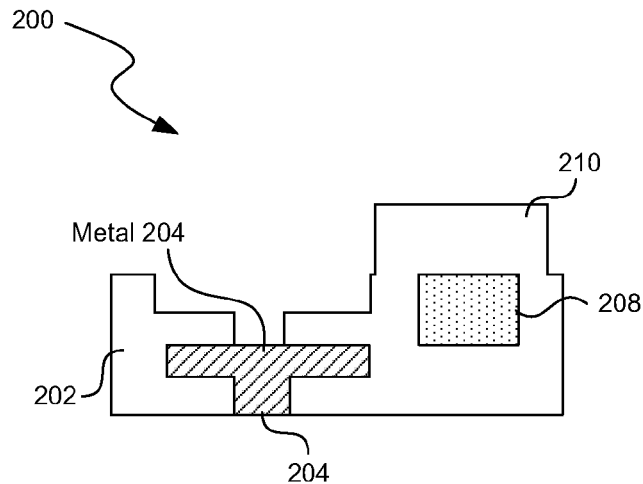

In the step illustrated in FIG. 2C, lithography is performed to selectively etch away dielectric material B retaining the portion for the core region 208 of the waveguide. In general, the etching of material B defines a lateral dimension of the core region 208 such that a subsequent metal layer can be formed in the back-end. Additional constraints on the lateral dimensions can be due to lithography requirements and limitations.

The deposited dielectric material B 208 can be removed elsewhere such that another interconnect layer can be fabricated. For example, referring to FIG. 2D, another layer of the same dielectric 210 is deposited as the insulating material in the subsequent interconnect (or metal) layer. In the step illustrated in FIG. 2E, the dielectric material 210 is selectively etched (e.g., after lithography) to create a formation for the interconnect layer. The etching step can include one step in the case of single damascene process, two times in the case of dual damascene process as shown in the figure.

Figure 2F:
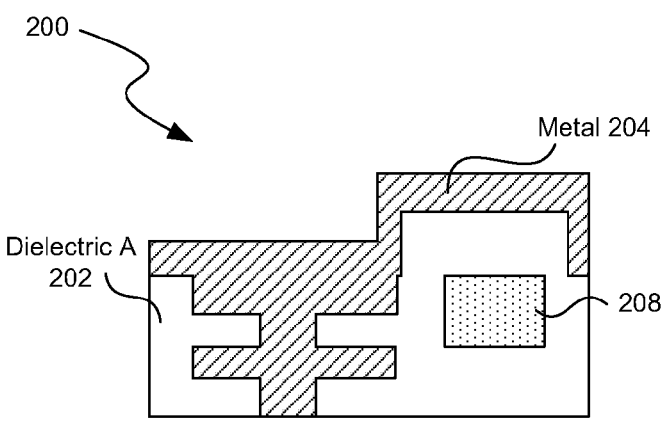
Figure 2G:
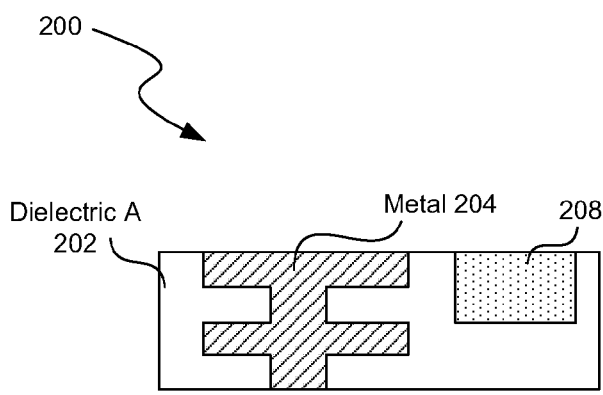

Referring next to FIG. 2F, the interconnect material (e.g., metal 204) is deposited over the structure and, as shown in FIG. 2G, the surface is planarized (e.g., via chemical mechanical polishing or other methods) to expose the metal contact 204 and the waveguide core 208.

It should be noted that since the thickness of dielectric B deposited in the step illustrated in FIG. 2B is limited by the thickness of one layer in the back-end (e.g., by the via and metal layer thicknesses), the core region 208 may need to be fabricated in multiple steps to reach the desired dimensions. For example, after the step illustrated in FIG. 2G, the process can re-start with the step shown in FIG. 2B to deposit additional layers of dielectric B 208 to increase the thickness of the waveguide core. Multiple iterations may be needed to reach the desired core 208 thickness. In one embodiment, for example, the material deposited in each iteration to form the core region 208 of the waveguide cladded by the dielectric material 202 in the metal layers can be different from the other layers in 208 such that the waveguide has a graded dielectric index (e.g., each iteration beginning in the step of FIG. 2B deposits a different dielectric B). When the desired thickness of dielectric 208 has been deposited for the waveguide core, another layer of dielectric A 202 can be deposited over the structure illustrated in FIG. 2B to clad the waveguide on the top side.

Figure 3A:
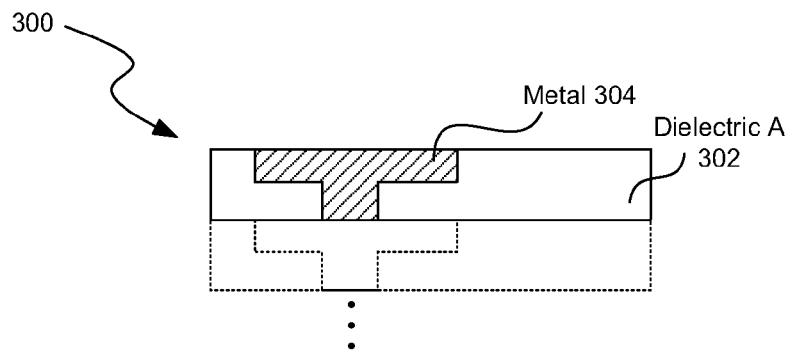
FIGS. 3A-3H are schematic illustrations of an example process for fabricating a waveguide in conjunction with back-end fabrication using liftoff in accordance with an embodiment of the disclosure.
Figure 3B:
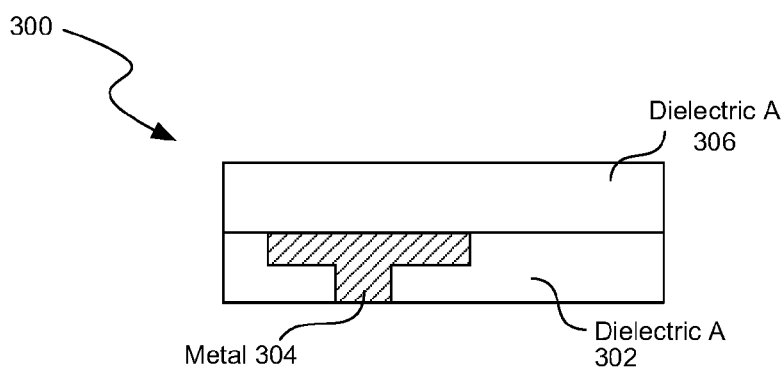

Because the number of precise lithography steps typically drives the cost of an IC, it can be desirable to use a process for back-end waveguide fabrication that does not increase the number of lithography steps. In one example, this can be achieved using damascene style fabrication of the dielectric waveguide. FIGS. 3A-3H, for example, are schematic illustrations of a process 300 for fabricating a waveguide in conjunction with back-end fabrication using liftoff in accordance with an embodiment of the disclosure. Referring first to FIG. 3A, the process 300 starts at the beginning of a cycle of fabrication in the back-end (e.g., in the interconnect layer). Although the step illustrated in FIG. 3A depicts an example showing that one interconnect layer (e.g., metal interconnect layer shown in solid black lines) has been fabricated, any number of layers (shown in gray dotted lines) in the back-end can be fabricated before deposition of dielectric A 306 (as shown in the step illustrated in FIG. 3B).

Figure 3C:
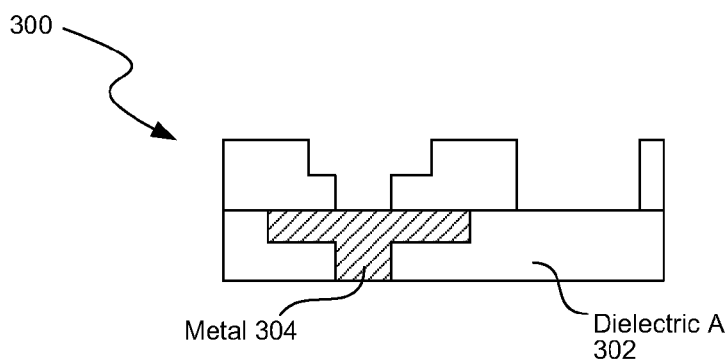

The deposited dielectric A 306 is typically the same material as the dielectric 302 used for insulation between conductive layers in the back-end of the integrated circuit and used as the cladding region of the waveguide being formed. Thus, as shown in FIG. 3C, the dielectric layer (the deposited dielectric A 306) is selectively etched (e.g., via lithography) to define a first region in the dielectric layer where material for a core region of a waveguide is to be deposited and to define a second region in the dielectric layer where metal or a metal structure in the back-end is to be deposited. In some embodiments, the selective etch can be completed in one step in the case of a damascene process, or two steps in the case of a dual damascene process.

Figure 3D:
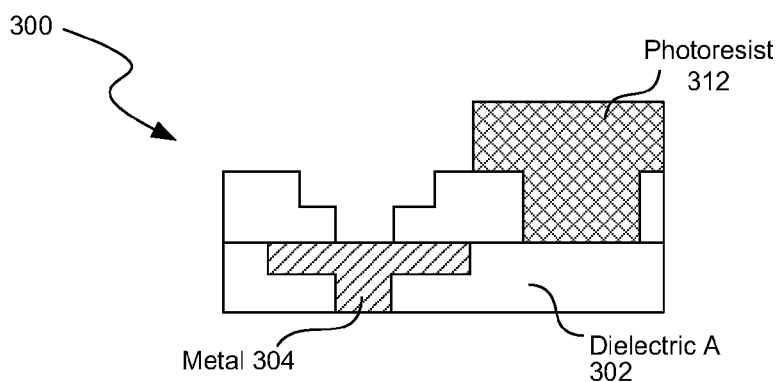
Figure 3E:
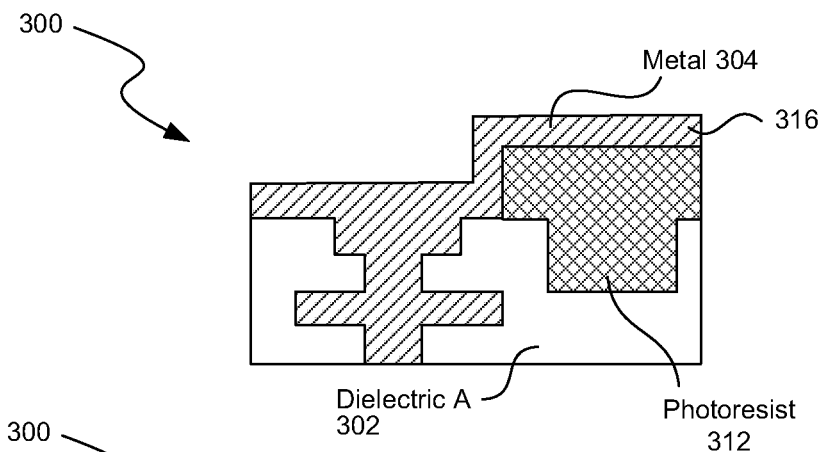
Figure 3F:
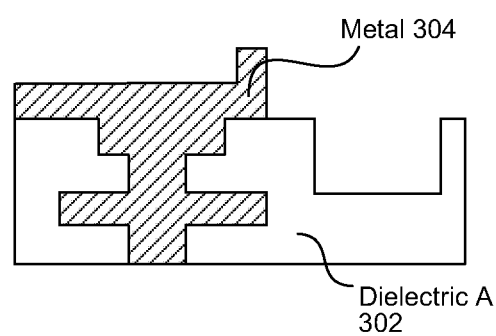
Figure 3G:
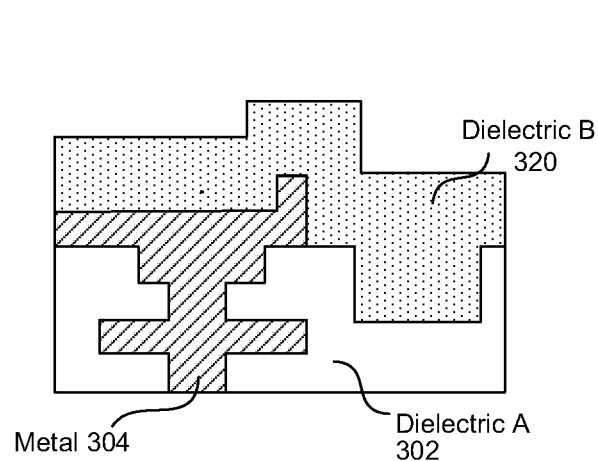

Referring next to FIG. 3D, the areas of the structure corresponding to the core region of the waveguide are masked with a photoresist 312. The masking can be achieved through, for example, coarse photolithography. In the step illustrated in FIG. 3E, metal is deposited over the resulting structure and into the etched formation for the metal structure in the back-end layer. Referring to FIG. 3F, the photoresist 312 is stripped (e.g., in a lift-off process) to expose the etched area having the formation to deposit the waveguide core was created. Referring next to FIG. 3G, the material for the waveguide core region or dielectric B 320 is deposited over the structure.

Figure 3H:
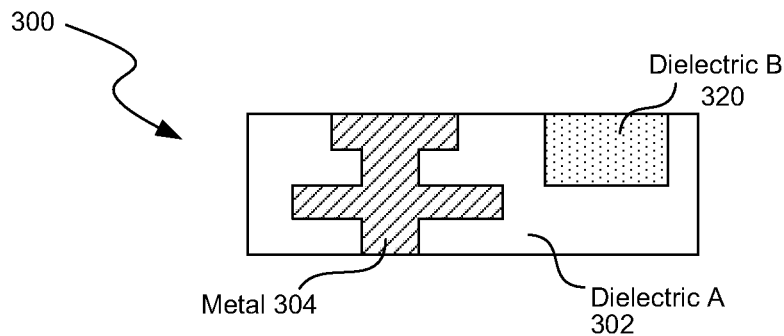

In the next step of the process 300 illustrated in FIG. 3H, the surface of the structure is planarized (e.g., via CMP) to expose the metal layer and the core region of the waveguide. The steps of the process 300 illustrated in FIGS. 3B-3H can be repeated to stack additional layers of material B on top of the material B shown in FIG. 3H in order to fabricate thicker waveguides having core regions that are thicker than one back-end interconnect layer. Once the desired core thickness has been reached, another layer of dielectric A can be deposited over the structure to form the upper cladding of the waveguide.

Note that in some instances, the order of metallic deposition and dielectric B deposition can be interchanged if compatible with the photoresist liftoff technique. Metal deposition is generally compatible with photoresist masking; as such, photoresist can typically be used to mask metal deposition. The converse could also be done, for example, by depositing dielectric B through sputtering. Generally, dielectrics are deposited by chemical vapor deposition (CVD) during back-end fabrication to obtain high quality materials from an electrical point of view. However electrical isolation consideration does not constrain the waveguide core dielectric.

In one embodiment, blanket implantation(s) can be applied to dielectric B 320 in order to increase its refractive index/dielectric constant, for example with germanium. Thus, dielectric B can be the same dielectric as dielectric A, since implantation can be used to increase its dielectric constant. Thus, when implantation is used to create the difference in dielectric constants, the step of process 300 illustrated in FIG. 3C can be modified such that the selective etching into the dielectric layer only etches away the region to deposit metal in the back-end. The photoresist masking shown in FIG. 3D can be omitted and metal can be deposited over the resulting structure. Once the surface has been planarized, lithography can be performed on the structure, followed by selective ion implantation of the dielectric to create a higher dielectric constant in the region of the dielectric A 302 where the core of the waveguide is to be defined. Note that the implantation can occur before or after the other steps, and does not need to occur at every cycle if the implantation depth is deep enough. The number of implantation steps can be reduced, possibly down to one.

Figure 4:
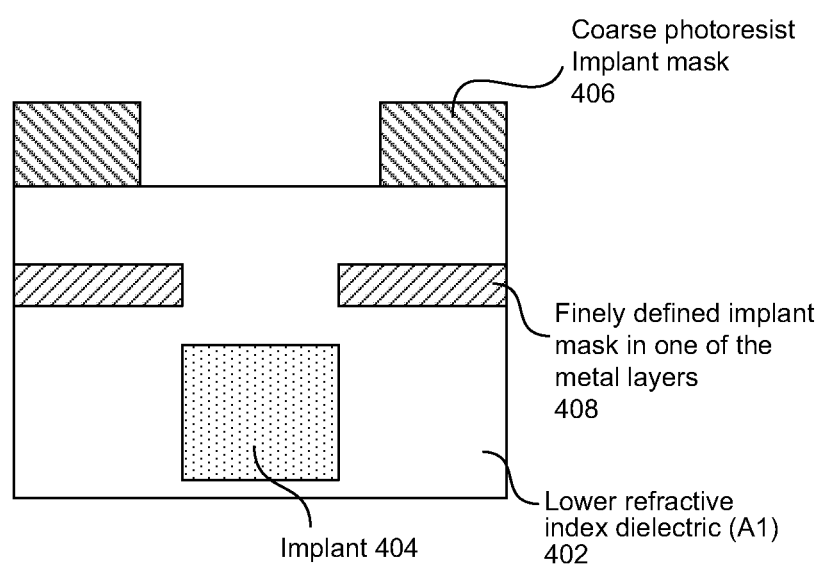
FIG. 4 is a schematic, cross-sectional side view of a device showing metal layers of the back-end utilized as implant stops for implanted waveguides in conjunction with a coarsely defined photoresist implant mask.

The number of required precision lithography steps can also be reduced in the case of implanted waveguides by using a previously defined metal layer as an implant stop. In order to avoid implanting the back-end in other places, it might still be necessary to use a coarse photoresist mask with an aperture on top of the waveguide, but with precise features defined by the metal layer (i.e., pieces of metal deposited at the same time can be used as an electrical conductor in other places of the IC). FIG. 4, for example, is a schematic, cross-sectional side view of a device showing metal layers 408 of the back-end utilized as implant stops for implanted waveguides in conjunction with a coarsely defined photoresist implant mask 406. This implantation technique can also allow definition of very fine features otherwise not obtainable with the thick photoresist masks required as implant stops. For example, a grating can be defined by defining a metal grating on top of the waveguide as an implant mask. Due to implant scattering, the resulting profile will not necessarily be binary but could be a gray scale modulation of implant density (with modulation properties such as modulation depth controllable by the duty cycle of the metal grating). An implant stop mask can be defined for this type of features in a metal layer used for vias, since vias are fine features and this layer can allow for finer features than a metal sheet layer. Fine waveguide tapers can be defined with this metal masking technique, as well controlled waveguide to waveguide spacing for devices such as directional couplers.

Figure 5:
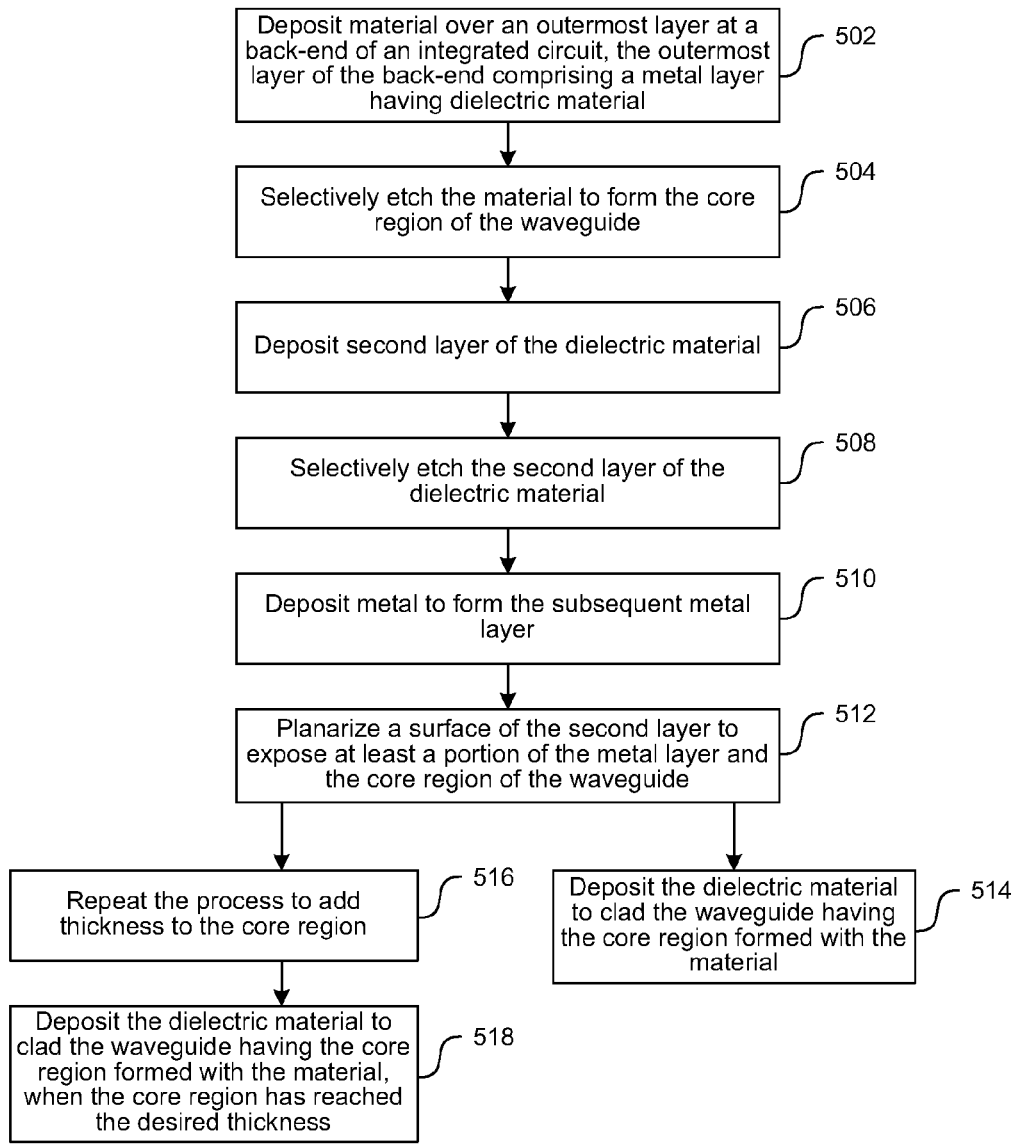
FIG. 5 is a flow chart illustrating stages of an example process for fabricating a waveguide in conjunction with back-end fabrication through direct etching to pattern the core dielectric in accordance with an embodiment of the disclosure. The process flow shown in the flow chart of FIG. 5 corresponds to the steps illustrated in the example flow shown graphically in FIGS. 2A-2G.

FIG. 5 is a flow chart illustrating stages of an example process for fabricating a waveguide in conjunction with back-end fabrication through direct etching to pattern the core dielectric in accordance with an embodiment of the disclosure. The process flow shown in the flow chart of FIG. 5 corresponds to the steps illustrated in the example flow shown graphically in FIGS. 2A-2G.

Beginning with block 502, material is deposited over an outermost layer at a back-end of an integrated circuit. The back-end of the IC includes interconnects for the active components (e.g., transistors, diodes, optoelectronic devices, etc.) and can include electrical and/or optical interconnects. As such, the outermost layer of the back-end can include an interconnect layer having dielectric material as insulators between the conductive materials in the back-end. The material that is deposited has a dielectric constant that can be used as a core region of a waveguide cladded by the dielectric material in the metal layer and is typically deposited to have a thickness substantially equal to one layer in the back-end of the integrated circuit. In the case of the back-end having electrical interconnects, for example, one layer in the back-end can include a single metal sheet or single metal via.

In block 504, the material is selectively etched to form the core region of the waveguide. The etching removes the material from the structure and defines a lateral dimension of the core region, leaving the portion which is defined for the waveguide core. The lateral dimension of the core region is defined such that a subsequent metal layer can be formed in the back-end. In general, patterning processes can include any of a wide variety of combinations of photolithographic and etching processes. Photolithographic process can include, for example, single- or multi-step photolithographic techniques employing one or more photoresist masks, such as a photolithographic mask including UV or deep UV light sensitive materials and optionally back anti-reflective coatings (BARC). Etching processes can include, for example, one or more wet and/or dry etch techniques to etch through a photoresist mask and create patterned features in an underlying layer or substrate, including chemical and/or physical etching techniques, employing, for example, isotropic or anisotropic wet and/or dry etch chemistries, reactive ion etches, and/or plasma assisted etches. Also, in some embodiments, a photoresist mask layer can also be employed in combination with a "hard" mask, such as a silicon nitride hard mask.

In block 506, a second layer of the dielectric material is deposited as the insulating material in the interconnect layer being fabricated in conjunction with the waveguide. A variety of deposition processes may be employed to form the dielectric layer, including chemical vapor deposition (CVD), physical vapor deposition (PVD), plasma enhanced CVD (PECVD), atomic layer deposition (ALD), or the like. Also, wafer bonding techniques may be employed. Further, the deposition process can be combined with a variety of other processes, such as CMP processes for planarizing the dielectric layer. In some embodiments, as discussed above, the dielectric layer may be a silicon-oxide based conformal film. Also, the dielectric layer may be implanted, annealed, or otherwise treated to tailor a dielectric constant.

In block 508, the second layer of the dielectric material is selectively etched. The etching creates the formation suited for deposition of metal material to form the metallic structure in the interconnect layer. In block 510, metal is deposited to form the metal layer, and in block 512, the surface of the second layer is planarized to expose the metal layer and the core region of the waveguide. It should be noted that the core region of the waveguide may be formed in its entirety with one layer of the material that is deposited. In this situation, the process continues in block 514 where the dielectric material can be deposited to clad the waveguide having the core region formed with the material.

Alternatively, in block 516, the process can be repeated starting at block 502 to add thickness to the core region (e.g., the entirety of the core region of the waveguide is formed while forming multiple layers in the back-end). In block 518, the dielectric material is deposited to clad the waveguide having the core region formed with the material, when the core region has reached the desired thickness.

Figure 6:
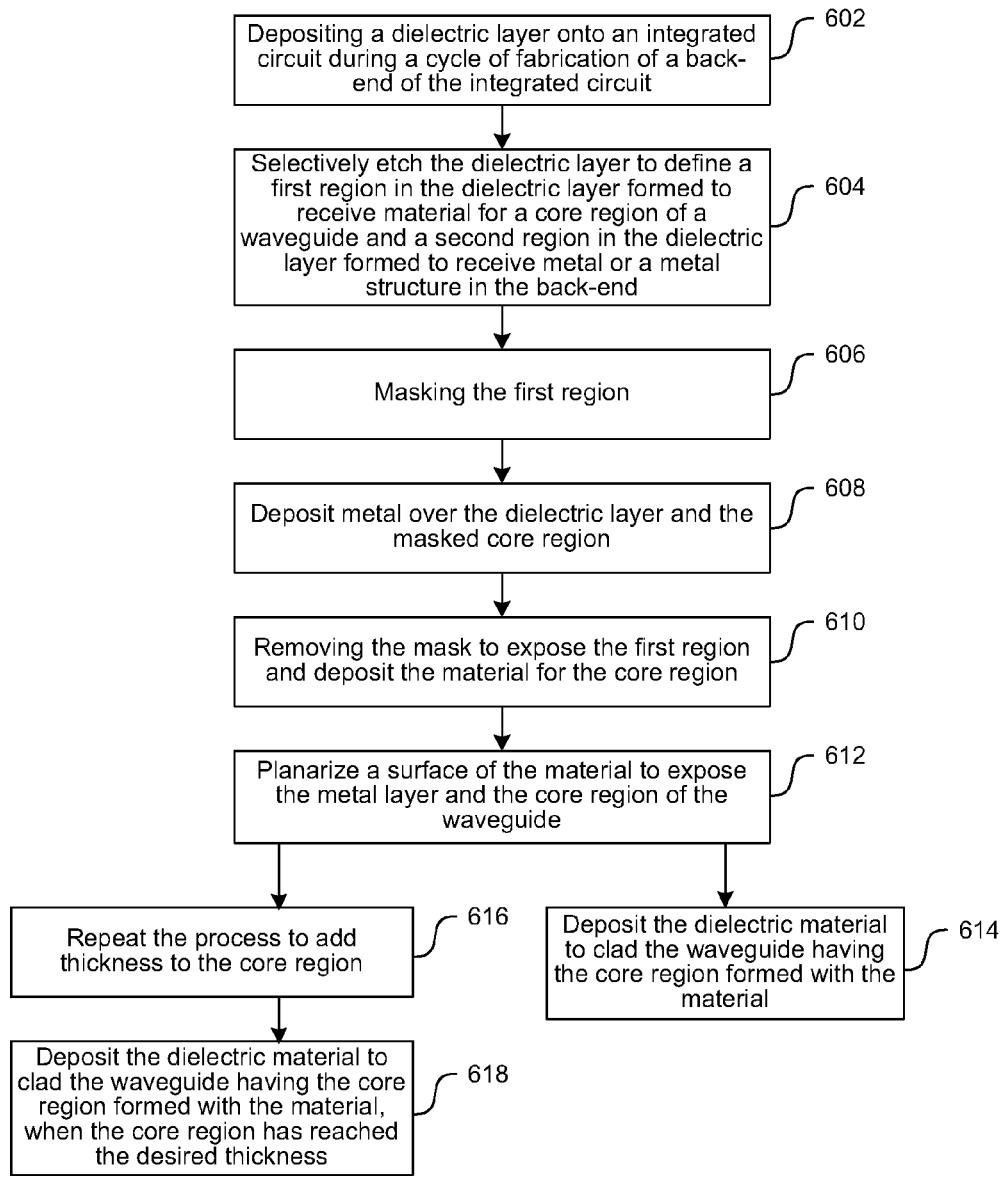
FIG. 6 is a flow chart illustrating stages of an example process for fabricating a waveguide in conjunction with back-end fabrication using liftoff in accordance with an embodiment of the disclosure. The process flow shown in the flow chart of FIG. 6 corresponds to the steps illustrated in the example flow shown graphically in FIGS. 3A-3H.

FIG. 6 is a flow chart illustrating stages of an example process for fabricating a waveguide in conjunction with back-end fabrication using liftoff in accordance with an embodiment of the disclosure. The process flow shown in the flow chart of FIG. 6 corresponds to the steps illustrated in the example flow shown graphically in FIGS. 3A-3H.

Beginning with block 602, a dielectric layer is deposited onto an integrated circuit during a cycle of fabrication of a back-end of an integrated circuit. A variety of deposition processes may be employed to form the dielectric layer, including CVD, PVD, PECVD, ALD, or the like. In block 604, the dielectric layer is selectively etched to define a first region in the dielectric layer formed to receive material for a core region of a waveguide is to be deposited and a second region in the dielectric layer formed to receive metal or a metal structure (e.g., a single metal sheet or a single metal via) in the back-end is to be deposited.

In one embodiment, the selective etching of the dielectric layer comprises etching the dielectric layer to a depth based, at least in part, on a thickness of one layer of the back-end (e.g., based on vertical metal to metal spacing). For example, a thickness of the core region can be tuned by the selective etching of the dielectric layer where the thickness of the core region can be defined, to correspond to a depth of any number of interconnect layers in the back-end. In block 606, the first region where the material for the core region of the waveguide is to be deposited is masked. In block 608, metal is deposited over the dielectric layer and the masked core region.

In block 610, the mask is removed to expose the first region. In addition, the material for the core region is deposited over the structure and into the first region. The material can include another dielectric material having a higher dielectric constant than that of the dielectric layer. Alternatively, the material includes a same material as the back-end dielectric but doped to have a higher dielectric constant. In block 612, the surface of the structure is planarized to expose the metal layer and the core region of the waveguide.

In some embodiments, the core region of the waveguide may be formed in its entirety with one layer of the material that is deposited. In this situation, the process continues in block 614 where the dielectric material can be deposited to clad the waveguide having the core region formed with the material. This technique also allows fabrication of dielectric core waveguides that are partially or fully clad by metallic material.

Alternatively, in block 616, the process can be repeated starting at block 602 to add thickness to the core region (e.g., the entirety of the core region of the waveguide is formed while forming multiple layers in the back-end). In block 618, the dielectric material is deposited to clad the waveguide having the core region formed with the material, when the core region has reached the desired thickness.

Breaking down the waveguide core deposition into several steps can be beneficial for mitigating stress accumulation during fabrication. For example, deposition of thick silicon nitride films can potentially result in large stress in the film. Depositing the material in several steps, with optional stress release anneals between deposition steps, reduces overall stress in the back-end and can potentially prevent wafer buckling or breakage. This provides further incentive to break down core dielectric deposition into several steps with thicknesses corresponding to thicknesses of one or several regular back-end layers such as vias or metal interconnects, or vertical metal to metal spacing.

Figure 7:
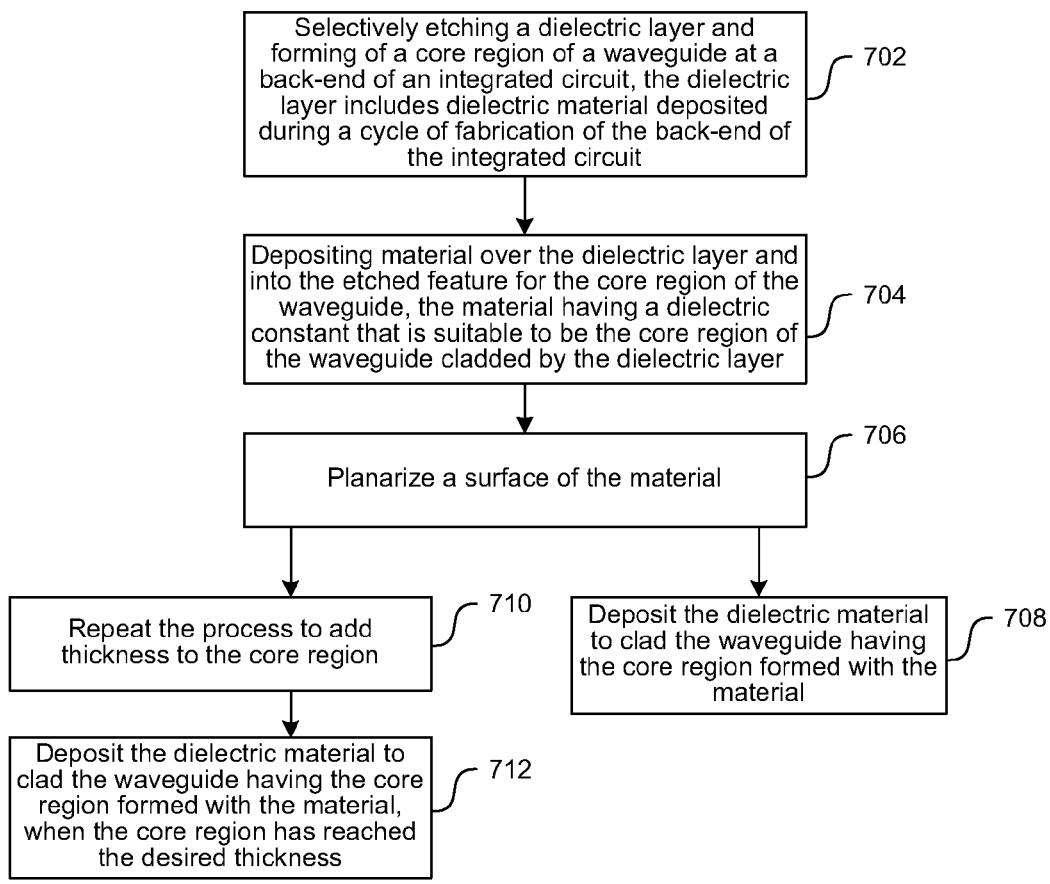
FIG. 7 is a flow chart illustrating stages of another example process for fabricating a waveguide in conjunction with back-end fabrication of an integrated circuit accordance with an embodiment of the disclosure.

FIG. 7 is a flow chart illustrating stages of another example process for fabricating a waveguide in conjunction with back-end fabrication of an integrated circuit in accordance with an embodiment of the disclosure. Beginning with block 702, a dielectric layer is selectively etched to form a core region of a waveguide at a back-end of an integrated circuit. The dielectric layer can be dielectric material deposited during a cycle of fabrication of the back-end of the integrated circuit.

In block 704, material is deposited over the dielectric layer and into the etched feature for the core region of the waveguide, the material having a dielectric constant that is suitable to be the core region of the waveguide cladded by the dielectric layer. In block 706, a surface of the material is planarized, for example, by performing chemical-mechanical polishing (CMP) or other methods. If that the core region of the desired waveguide is formed in its entirety with one layer of the material that is deposited, the process continues in block 708 where the dielectric material can be deposited to clad the waveguide having the core region formed with the material.

Alternatively, in block 710, the process can be repeated starting at block 702 to add thickness to the core region (e.g., the entirety of the core region of the waveguide is formed while forming multiple layers in the back-end). In block 712, the dielectric material is deposited to clad the waveguide having the core region formed with the material, when the core region has reached the desired thickness.

In this embodiment, it can also be beneficial to deposit the core material one layer at a time (i.e., the thickness of individual stacked layers of the core material corresponds to the thickness of a singe via or metal interconnect) because the same etch stop techniques can be used as for the regular back-end processing. For example, if the etches of back-end dielectrics are timed etches, the same etch time can be used as when etching back-end dielectrics for the purpose of the metal deposition damascene process, since the same layer is etched through in both cases.

If the core material is deposited with an individual layer thickness corresponding to several metal interconnect or via layers, and the etch prior to deposition is a timed etch, the timed-etch time can be derived from the etch times used for the corresponding etches during processing for the regular back-end. For example, if back-end dielectrics A1 and A2 are selectively etched and replaced by the core material, the etch time can be derived from the etch times used to etch dielectrics A1 and A2 during back-end processing. One way is to add etch times, but since etches are typically non-linear, a more complex formula (e.g., with empirically determined higher order non-linearities) may yield better results. Data collected during etching of layers A1 and A2 during regular back-end processing can be fed forward in the line to adjust etch times during waveguide core fabrication.

Fabricating the dielectric waveguides in multiple steps, also allows fabricating waveguides with complex cross-sections, since the local width of the waveguide at each of the steps can be individually tailored. Specifically, the refractive/dielectric index of the core material can be adjusted at each step, or the implant type, dose and energy, in order to fabricate graded index dielectric waveguides.

The manufacturing techniques described here also allow for the fabrication of vertically stacked slot waveguides to enhance non-linear effects. For example, during deposition of the core material, the material type or stoikiometric can be briefly changed to fabricate a thin slot inside the waveguide, in the form of a thin film with different refractive index.

The processes described in example flow charts of FIGS. 5-7 yield an integrated circuit (e.g., electrical and/or photonic circuit) having an integrated waveguide fabricated in conjunction with forming interconnect layers in the back-end of the IC. In one embodiment, the resulting integrated circuit includes multiple interconnect layers with each interconnect layer having a conducting material and an insulating material and an optical waveguide formed in the multiple interconnect layers. The optical waveguide has a core region and a cladding region. The cladding region is formed, at least in part, from material existing in the interconnect layers in the back-end of the integrated circuit. In general, the core region of the optical waveguide corresponds in thickness to a total thickness of one or more of the multiple interconnect layers and the core material forming the core region is deposited during fabrication of one or more of the multiple interconnect layers. The core material has a higher dielectric constant than the material existing in the interconnect layers forming the cladding region of the optical waveguide.

The integrated circuit can include photonics components and the multiple interconnect layers can include optical interconnects and/or electrical interconnects. The core material forming the core region includes material different than that of the insulating material of the interconnect layers. The core material can alternatively include the same material as the insulating material and is doped to have a higher dielectric constant than that of the insulating material of the interconnect layers. In one embodiment, the optical waveguide is a graded index dielectric waveguide. In another embodiment, the optical waveguide is fully or partially clad by metal. In still another embodiment, the optical waveguide is a slot waveguide.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number, respectively. Additionally, the words "herein," "above," and "below" and words of similar import, when used in this application, shall refer to this application as a whole and not to any particular portions of this application.

The description of embodiments of the disclosure is not intended to be exhaustive or to limit the disclosure to the precise form disclosed. Furthermore, while specific embodiments of, and examples for, the disclosure are described herein for illustrative purposes, various equivalent modifications are possible within the scope of the disclosure, as those skilled in the relevant art will recognize. For example, while process steps or functions are presented in a given order, alternative embodiments may perform functions in a different order, or functions may be performed substantially concurrently. The teachings of the disclosure provided herein can be applied to other systems, not only the system described herein. The various embodiments described herein can be combined to provide further embodiments.

All of the references cited herein are incorporated by reference. Aspects of the disclosure can be modified, if necessary, to employ the systems, functions and concepts of the above references and application to provide yet further embodiments of the disclosure. These and other changes can be made to the disclosure in light of the Detailed Description.

Specific elements of any of the foregoing embodiments can be combined or substituted for elements in other embodiments. Furthermore, while advantages associated with certain embodiments of the disclosure have been described in the context of these embodiments, other embodiments may also exhibit such advantages, and not all embodiments need necessarily exhibit such advantages to fall within the scope of the disclosure. Accordingly, embodiments of the disclosure are not limited except as by the appended claims.

We claim:

1. A method, comprising:
   depositing a first dielectric material over both a metallic portion and a second dielectric material of an outermost layer at a back-end of an integrated circuit, and wherein the deposited first dielectric material has a dielectric constant for a core region of a waveguide cladded by the second dielectric material in the outermost layer; and
   after depositing the first dielectric material, selectively etching the first dielectric material to form the core region of the waveguide from the first dielectric material, wherein etching of the first dielectric material defines a lateral dimension of the core region,
   wherein the lateral dimension of the core region is defined by the etching, such that a subsequent metal layer can be formed in the back-end.

2. The method of claim 1 wherein the deposited first dielectric material comprises a first layer of first dielectric material, and wherein the method further comprises:
   depositing a second layer of first dielectric material over the first layer of first dielectric material;
   selectively etching the second layer of the first dielectric material;
   depositing metal to form the subsequent metal layer; and
   planarizing a surface of the second layer to expose at least a portion of the metal layer and the core region of the waveguide.

3. The method of claim 1 wherein depositing the first dielectric material over the outermost layer comprises depositing the first dielectric material to have a thickness substantially equal to one layer in the back-end of the integrated circuit.

4. The method of claim 1 wherein the core region of the waveguide is formed in its entirety with one layer of the deposited first dielectric material.

5. The method of claim 1, further comprising repeating the depositing of the first dielectric material and selective etching of the first dielectric material to form multiple layers in the back-end and define a thickness of the core region, and wherein the entirety of the core region of the waveguide is formed while forming the multiple layers in the back-end.

6. The method of claim 5 wherein the first dielectric material deposited in each iteration to form the core region of the waveguide cladded by the second dielectric material in the outermost layer can be different from the other layers such that the waveguide has a graded dielectric index.

7. An integrated circuit, comprising:
multiple interconnect layers electrically coupled together, wherein two or more interconnect layers comprise conducting material and insulating material, and wherein a first portion of the conducting material is exposed at an outermost layer and a second portion of the conducting material is exposed at a second layer different from the outermost layer; and
an optical waveguide formed in the multiple interconnect layers, wherein the optical waveguide comprises a core region and a cladding region, the cladding region being formed, at least in part, from material existing in the interconnect layers,
wherein the core region of the optical waveguide corresponds in thickness to a total thickness of one or more of the multiple interconnect layers, and
wherein core material forming the core region is deposited during fabrication of one or more of the multiple interconnect layers and is selectively etched to form the core region of the optical waveguide, the core material having a higher dielectric constant than the material existing in the interconnect layers forming the cladding region of the optical waveguide.

8. The integrated circuit of claim 7 wherein the integrated circuit comprises photonics components, and wherein the multiple interconnect layers comprise optical interconnects.

9. The integrated circuit of claim 7 wherein the multiple interconnect layers comprise electrical interconnects.

10. The integrated circuit of claim 7 wherein the core material forming the core region includes material different than that of the insulating material of the interconnect layers.

11. The integrated circuit of claim 7 wherein the core material comprises the same material as the insulating material and is doped to have a higher dielectric constant than that of the insulating material of the interconnect layers.

12. The integrated circuit of claim 7 wherein the optical waveguide comprises a graded index dielectric waveguide.

13. The integrated circuit of claim 7 wherein the optical waveguide is fully or partially clad by metal.

14. The integrated circuit of claim 7 wherein the optical waveguide comprises a slot waveguide.

* * * * *

UNITED STATES PATENT AND TRADEMARK OFFICE
CERTIFICATE OF CORRECTION

| | | |
|---|---|---|
| PATENT NO. | : 8,761,552 B1 | Page 1 of 1 |
| APPLICATION NO. | : 12/963488 | |
| DATED | : June 24, 2014 | |
| INVENTOR(S) | : Michael J. Hochberg et al. | |

It is certified that error appears in the above-identified patent and that said Letters Patent is hereby corrected as shown below:

In the Specification

Column 3, line 62, delete "oxinitride" and insert -- oxynitride --, therefor.

Column 8, line 58, delete "singe" and insert -- single --, therefor.

Column 9, line 23, delete "stoikiometric" and insert -- stoichiometric --, therefor.

Signed and Sealed this
Twenty-third Day of September, 2014

Michelle K. Lee
*Deputy Director of the United States Patent and Trademark Office*